US012753484B2

(12) United States Patent
Ebersold et al.

(10) Patent No.: US 12,753,484 B2
(45) Date of Patent: Oct. 6, 2026

(54) WEAR RESISTANT COATING PRODUCED FROM AT LEAST TWO DIFFERENT AlCr-BASED TARGETS

(71) Applicant: Oerlikon Surface Solutions AG, Pfäffikon, Pfäffikon (CH)

(72) Inventors: Marijana Mionic Ebersold, Dübendorf (CH); Oliver Hunold, Wädenswil (CH)

(73) Assignee: OERLIKON SURFACE SOLUTIONS AG, PFÄFFIKON, Pfäffikon (CH)

(*) Notice: Subject to any disclaimer, the term of this patent is extended or adjusted under 35 U.S.C. 154(b) by 305 days.

(21) Appl. No.: 18/257,122

(22) PCT Filed: Dec. 14, 2021

(86) PCT No.: PCT/EP2021/085761
§ 371 (c)(1),
(2) Date: Jun. 13, 2023

(87) PCT Pub. No.: WO2022/129094
PCT Pub. Date: Jun. 23, 2022

(65) Prior Publication Data
US 2024/0102144 A1 Mar. 28, 2024

Related U.S. Application Data

(60) Provisional application No. 63/124,986, filed on Dec. 14, 2020.

(51) Int. Cl.
*C23C 14/06* (2006.01)
*C04B 41/50* (2006.01)
(Continued)

(52) U.S. Cl.
CPC ...... *C23C 14/0021* (2013.01); *C04B 41/5063* (2013.01); *C23C 14/0641* (2013.01);
(Continued)

(58) Field of Classification Search
CPC ............ C23C 14/0617; C23C 14/0641; C23C 14/0647; C23C 14/0652; C23C 14/0658;
(Continued)

(56) References Cited

U.S. PATENT DOCUMENTS

2005/0003239 A1* 1/2005 Derflinger ........... C23C 16/0281 204/192.12
2006/0269788 A1* 11/2006 Ishikawa ............... C23C 14/325 428/701
(Continued)

FOREIGN PATENT DOCUMENTS

EP 3290137 A1 3/2018
EP 3346026 A1 7/2018
(Continued)

OTHER PUBLICATIONS

Machine translation of JP 3598074 B2.*
(Continued)

*Primary Examiner* — Z. Jim Yang
(74) *Attorney, Agent, or Firm* — Chrisman Gallo Tochtrop LLC

(57) ABSTRACT

Coating system deposited on a surface of a substrate including an under coating film, an interjacent coating film deposited as a multi-layered film, including a plurality of A-layers and a plurality of B-layers deposited alternating one on each other forming a A/B/A/B/A . . . architecture, the A-layers including aluminium chromium and optionally one or more dopant elements and the B-layers including aluminium chromium nitride and one or more dopant elements.

19 Claims, 7 Drawing Sheets

Figure 1A:
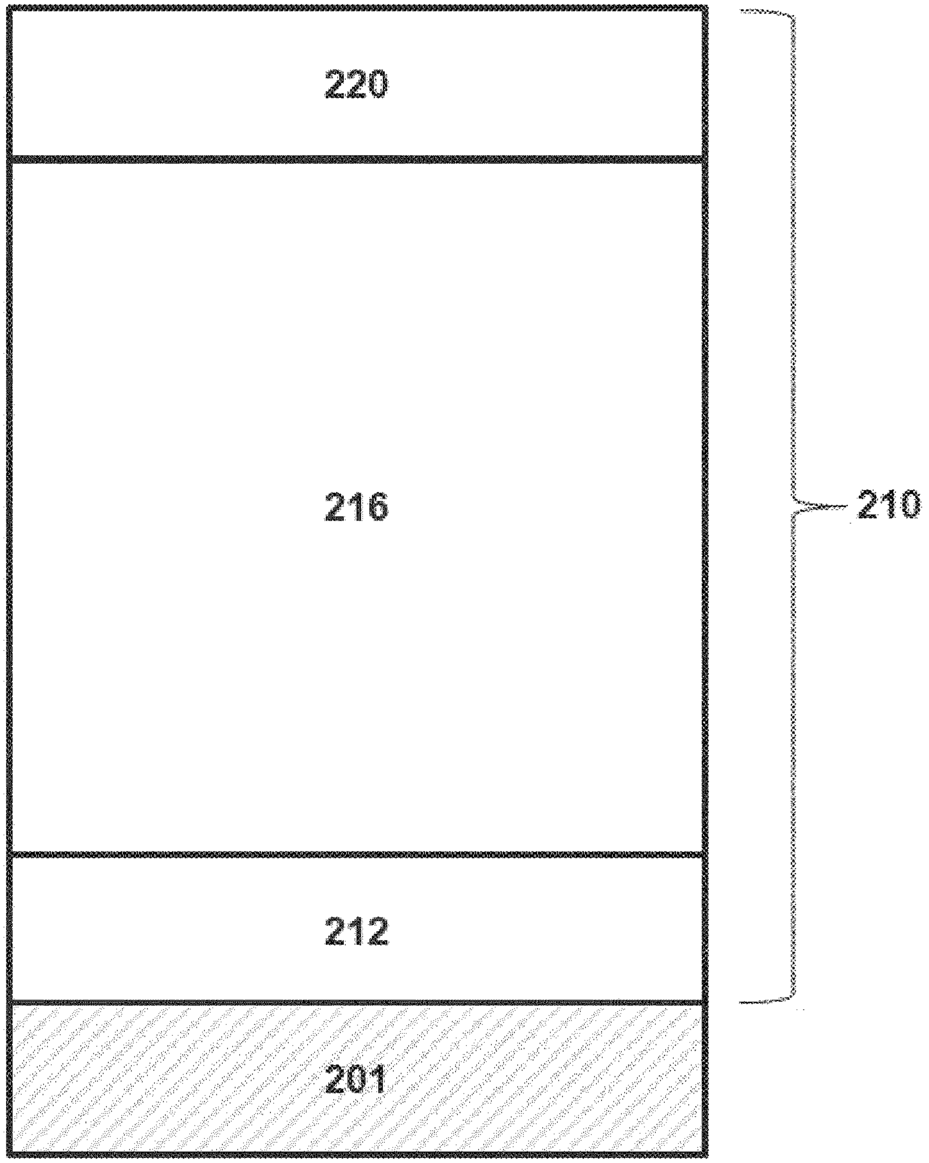

(51) Int. Cl.

| | |
|---|---|
| ***C23C 14/00*** | (2006.01) |
| ***C23C 14/14*** | (2006.01) |
| ***C23C 14/32*** | (2006.01) |
| ***C23C 30/00*** | (2006.01) |

(52) U.S. Cl.
CPC ............ *C23C 14/14* (2013.01); *C23C 14/325* (2013.01); *C23C 30/005* (2013.01); *B23B 2224/08* (2013.01)

(58) Field of Classification Search
CPC ............ C23C 14/0664; C23C 14/0676; C23C 16/301; C23C 16/303; C23C 16/308; C23C 16/34–36; C23C 30/005; C23C 28/04–44; C04B 41/52; C04B 41/522; C04B 41/524; C04B 41/526; C04B 41/89; C04B 41/5063
See application file for complete search history.

(56) References Cited

U.S. PATENT DOCUMENTS

| | | | | |
|---|---|---|---|---|
| 2008/0229891 | A1* | 9/2008 | Lechthaler | C23C 14/0641 83/13 |
| 2008/0318062 | A1* | 12/2008 | Endrino | C23C 14/0664 428/428 |
| 2009/0252973 | A1* | 10/2009 | Cremer | H01J 37/3467 204/192.1 |
| 2015/0056431 | A1* | 2/2015 | Arnd | C23C 14/3492 204/192.15 |
| 2016/0040279 | A1* | 2/2016 | Setoyama | C04B 41/52 428/216 |
| 2018/0044773 | A1* | 2/2018 | Eriksson | C23C 28/42 |
| 2018/0117680 | A1* | 5/2018 | Tanaka | B23B 51/00 |
| 2018/0193924 | A1* | 7/2018 | Tanaka | C23C 14/0658 |
| 2019/0249311 | A1* | 8/2019 | Sakurai | C23C 28/027 |
| 2020/0180039 | A1* | 6/2020 | He | C23C 28/42 |
| 2021/0060657 | A1* | 3/2021 | Kinoshita | B23B 27/14 |
| 2022/0281013 | A1* | 9/2022 | Schröder | C23C 14/3464 |
| 2023/0119858 | A1* | 4/2023 | Sato | C23C 14/0617 428/698 |

FOREIGN PATENT DOCUMENTS

| | | | | |
|---|---|---|---|---|
| EP | 3382061 | A1 | | 10/2018 |
| JP | 3598074 | B2 | * | 12/2004 |
| JP | 2007105843 | A | * | 4/2007 |
| WO | 2013156131 | A1 | | 10/2013 |
| WO | 2016102170 | A1 | | 6/2016 |

OTHER PUBLICATIONS

Machine translation of JP 2007/105843 A.*
International Search Report and Written Opinion issued in Application No. PCT/EP2021/085761 dated Feb. 23, 2022.

* cited by examiner

State of the art as market benchmark

T05_MA_P1_E01_025.6m_100x_VHX1000.jpg

T05_MA_P1_E01_038.4m_100x_VHX1000.jpg

T05_MA_P1_E01_051.2m_100x_VHX1000.jpg

Inventive example 1

T02_MA_P1_E01_025.6m_100x_VHX1000.jpg

T02_MA_P1_E01_038.4m_100x_VHX1000.jpg

T02_MA_P1_E01_051.2m_100x_VHX1000.jpg

T02_MA_P1_E01_064.0m_100x_VHX1000.jpg

T02_MA_P1_E01_076.8m_100x_VHX1000.jpg

T02_MA_P1_E01_089.6m_100x_VHX1000.jpg

T02_MA_P1_E01_102.4m_100x_VHX1000.jpg

State of the art as market benchmark

Inventive example 2

WEAR RESISTANT COATING PRODUCED FROM AT LEAST TWO DIFFERENT AlCr-BASED TARGETS

The present invention relates to an AlCrN-based coating which exhibits outstanding wear resistance in machining operations such as milling both roughing and finishing. The present invention relates furthermore to a method for applying the coating system (hereafter also called coating scheme).

More specifically, the invention relates to a coated article with a coating scheme including AlCrN-based layers, which can be deposited with variable thickness, so that at least some of the AlCrN-based layers in the coating scheme can be nanolayers.

Exemplary coated articles in this context include without limitation cutting tools, such as end mills, forming tools and wear components.

STATE OF THE ART

Anders et al. propose in WO 2016/102170 A1 a coating system for reducing crater wear of cutting tools by machining operations, which is expected to be particularly beneficial in dry machining operations such as hobbing.

The coated article and the coating method according to WO 2016/102170 A1 by Eriksson et al. already lead to good results. However, steady new increased demands need to be met. Therefore, in spite of the benefits attained with the above mentioned coating as well as with other currently available coatings, there is still a need for new coatings exhibiting a combination of enhanced properties such as outstanding abrasion resistance, thermal barrier properties and enhanced resistance against generation and propagation of cracks.

In particular in the case of coated end mills, for mentioning one example of a coated article, a coated end mill typically comprises a substrate with a coating scheme (also called coating system) thereon. Coated end mills are useful for the removal of material in a chip forming material removal operation. Depending on the workpiece material, machining process and cutting parameters, a great amount of both wear, especially abrasive, and crack formation and propagation (especially in wet machining) and/or transfer of the heat (especially in dry machining) can exist at the interface of end mill and chip. Therefore, both wear, especially abrasive wear, and crack formation and propagation (especially in wet machining) and/or transfer of the heat (especially in dry machining) at the cutting chip interface into the substrate and the interface between the coating scheme and the substrate (i.e. coating-substrate interface) can be detrimental to end mills performance.

The coating scheme typically influences wear, crack formation and propagation and the extent of heat transfer from the end mill-chip interface to the substrate and coating-substrate interface. The physical chemical properties of the coating scheme strongly influence all wear, crack formation and propagation and the extent of such heat transfer.

Objective of the Present Invention

A main objective of the present invention is to provide a coating solution to overcome the drawbacks of the coatings according to the state of the art.

In particular the present invention should provide a new coating system that exhibits enhanced properties which can be suitable to meet the growing demands in diverse machining operations such as milling, both roughing and finishing.

More concretely the present invention should provide coating scheme that in comparison to the state of the art allows significantly higher wear resistance by simultaneous reduction of abrasive wear, crater wear and thermal crack formation and propagation, and consequently significantly increasing cutting performance and life time of cutting tools used in machining operations, particularly in milling. Furthermore, it is an objective of the present invention to provide the method of applying a coating scheme according to the present invention which should be applicable for coating of cutting tools.

DESCRIPTION OF THE INVENTION

According to a first aspect of the present invention, disclosed is a coating system deposited on a surface of a substrate comprising an under coating film, an interjacent coating film deposited as a multi-layered film, consisting of a plurality of A-layers and a plurality of B-layers deposited alternating one on each other forming a A/B/A/B/A . . . architecture, the A-layers comprising aluminium chromium and optionally one or more dopant elements and the B-layers comprising aluminium chromium nitride and one or more dopant elements, wherein the under coating film is deposited on the surface of the substrate to be coated or in any case closer to the substrate than the interjacent coating film, the interjacent coating film is deposited between the under coating film and the upper coating film, the upper coating film is deposited more distant from the substrate than the interjacent coating film, the A-layers comprise aluminium (Al), chromium (Cr) and nitrogen (N), or aluminium (Al), chromium (Cr), nitrogen (N) and one or more dopant elements selected from boron (B), yttrium (Y), tantalum (Ta), silicon (Si), tungsten (W), titanium (Ti), calcium (Ca), magnesium (Mg), iron (Fe), cobalt (Co), zinc (Zn) and niobium (Nb), the B-layers comprise aluminium (Al), chromium (Cr), nitrogen (N) and one or more dopant elements selected from boron (B), yttrium (Y), tantalum (Ta), silicon (Si), tungsten (W), titanium (Ti), calcium (Ca), magnesium (Mg), iron (Fe), cobalt (Co), zinc (Zn) and niobium (Nb), wherein the A layers differ from the B layers at least in the chemical composition, wherein at least one chemical element is present in the B layers but not present in the A layers or is present in the B layers but not present in the A layers, or if both A layers and B layers contains the same chemical elements, then the concentration of the chemical elements in the B layers differs from the concentration of the chemical elements in the A layers and the concentration of the one or more dopants in the B layers is higher than the concentration of the one or more dopant elements in the A layers, if any.

In another example of the first aspect, the upper coating film may be deposited as outermost layer of the coating system.

In another example of the first aspect, the individual layer thickness of the A layers may be greater than the individual layer thickness of the B layers.

In another example of the first aspect, the ratio between the individual layer thickness of the A layers in relation to the individual layer thickness of the B layers may be in a range between 1% and 600%, preferably 50% to 400% greater.

In another example of the first aspect, the thickness of the under coating film may be between 65% and 97% of the total thickness of the coating system.

In another example of the first aspect, the thickness of the upper coating film may be between 3% and 35% of the total thickness of the coating system.

In another example of the first aspect, the layer thickness of the upper coating film may be lower than the layer thickness of the under coating film.

In another example of the first aspect, the upper coating film or at least a section of the upper coating film or at least some of the A layers and/or some of the B-layers may be comprised in the upper coating film, if any, and/or the interjacent coating film or at least a section of the interjacent coating film, or at least some of the A layers and/or some of the B-layers is comprised in the interjacent coating film comprised in addition to nitrogen (N) also oxygen (O) and/or carbon (C).

In another example of the first aspect, the concentration in atomic percentage of carbon and/or oxygen in one coating layer or in one coating film forming the coating system may be between 3 at. % and 38 at. %, if only the concentrations of N, C and O are considered, it means, if the sum of the concentrations of N, C and O in the respective coating layer or coating film may be considered as 100 at. %

In another example of the first aspect, the concentration in atomic percentage of the dopant elements in the B layers and in the case that the A layers comprise dopant elements, then also in the A layers may vary along the total thickness of the interjacent coating film of the coating system, the range of variation may be preferably between 0.1% and 600% taking as base the lowest concentration of the respective dopant elements in the interjacent coating film.

In another example of the first aspect, the interjacent coating film may comprise different film sections, with i varying from i=1 to i=n, where i and n are natural numbers, i.e. comprising sections, where the number of the film sections is at least one. i.e. n≥1, preferably more than one, i.e. n≥2, wherein each one of said interjacent film sections may comprise an under portion and an upper portion, each one of the portions may be formed by one or more bilayers b, each bilayer b may be formed by one layer A and one layer B, wherein all A layers within the extension of the thickness of the interjacent coating film may comprise the same chemical elements but not necessarily in the same concentration, and all B layers within the extension of the thickness of the interjacent coating film may comprise the same chemical elements but not necessarily in the same concentration, wherein at least two interjacent film sections deposited one on each other, e.g. 216.1 and 216.2 may differ in at least one of the following physical chemical properties: predominant crystalline orientation, crystalline size and/or crystalline size distribution—as all calculated from peak intensities and areas below the peaks and the full width at the half maximum from X-Ray diffractograms-, mechanical properties such as hardness, elastic and modulus, chemical composition.

In another example of the first aspect, at least two under portions belonging respectively to two consecutive deposited interjacent film sections may exhibit different intrinsic stress, where **216.*i* is closer to the substrate than 216.*i***+1, and the under portion that is closer to the substrate may exhibit lower intrinsic stress than the other under portion.

In another example of the first aspect, the under coating may comprise the same elements than the layer A In another example of the first aspect, the upper coating film may comprise either:

1) the same chemical elements as the layers B, and in this case the upper coating film may be produced by using the same targets used for the deposition of the layers B, preferably deposited as monolayer, or
2) the same chemical elements of the layers A and the same chemical elements of the layers B, and in this case the upper coating film may be produced as multilayer by using respectively the same targets used for the deposition of the layers A and layers B in the interjacent coating film but the upper coating film may have a different ratio of thickness of layers A and B and a different chemical composition in comparison with the interjacent coating film, wherein the thickness of the individual layers A with respect to the thickness of the individual layers B in the upper coating film (220) may be either lower or equal or higher but if $A_{layer\_thickness\_in\_220}/B_{layer\_thickness\_in\_220}>0$, then $A_{layer\_thickness\_in\_216}/B_{layer\_thickness\_in\_216}>A_{layer\_thickness\_in\_220}/B_{layer\_thickness\_in\_220}$.

In another example of the first aspect, the concentration of the dopant elements in the under coating film, if any, as well as in the upper coating film may vary along the total thickness of the under coating film.

In another example of the first aspect, the concentration of the dopant elements may vary along the total thickness of the upper coating film of the coating system.

In another example of the first aspect, the range of variation may be between 0.1% and 600% taking as base the lowest concentration of the respective dopant elements in the under coating film or in the upper coating film, respectively.

According to a second aspect of the present invention, disclosed is a method for producing a coating system according to the first aspect, wherein the coating system is produced by using a reactive cathodic arc PVD method, wherein for the deposition of the A layers one or more $A_{source}$-targets is used, and wherein for the deposition of the B layers one or more $B_{source}$-targets is used, wherein at least nitrogen gas is used as reactive gas, and the $A_{source}$-targets comprise Al and Cr and optionally one or more dopant elements selected from B, Y, Ta, Si, W, Ti, Ca, Mg, Fe, Co, Zn and Nb, and the B layers $B_{source}$-targets comprise Al and Cr and one or more dopant elements selected from B, Y, Ta, Si, W, Ti, Ca, Mg, Fe, Co, Zn and Nb, wherein the $A_{source}$-targets and the $B_{source}$-targets, if both comprise one or more dopant elements, they differ one from each other in at least one dopant element, and wherein during the deposition of the coating system at least one of the following parameters:

gas pressure, temperature, bias voltage, source current, magnetic field shape and/or strength and reactive gases, are varied for varying at least one of the following physical chemical properties of the coating:

predominant crystalline orientation, crystalline size and/or crystalline size distribution—as all calculated from peak intensities and areas below the peaks and the full width at the half maximum from X-Ray diffractograms-, mechanical properties such as hardness and elastic modulus, and chemical composition.

DETAILED DESCRIPTION

For better explaining the present invention the FIGS. 1 to 8 will be used.

FIG. 1 is used in particular for schematically showing preferred embodiments of the inventive coating system (also called coating scheme). FIG. 1 comprises FIG. **1*a*, FIG. 1*b*, FIG. 1*c* and FIG. 1*d*** (a) and (b).

A basic embodiment of a coating system according to the present invention is shown schematically in FIG. **1*a***.

The inventive coating system 210 (or coating scheme 210) comprises at least three coating films: an under coating film 212 (the under coating film can be also referred to as under coating layer), an interjacent coating film 216 and an upper coating film 220 (the upper coating film can be also referred to as upper coating layer).

The under coating film 212 is deposited on a surface of a substrate 201 to be coated or in any case (if any other layer is deposited between the substrate 201 and the under coating film 212) closer to the substrate 201 than the interjacent coating film 216.

The interjacent coating film 216 is deposited between the under coating film 212 and the upper coating film 220.

The upper coating film 220 is deposited more distant from the substrate 201 than the interjacent coating film 216.

Preferably the upper coating film 220 is deposited as outermost layer of the coating system 210.

The interjacent coating film 216 is deposited as multi-layered film comprising a plurality of layers of the type A (hereafter also called A layers) and a plurality of layers of the type B (hereafter also called B layers).

The A layers and B layers are deposited alternatingly one on each other forming a sequency of layers A/B/NB/A . . . .

The A-layers comprise aluminium (Al), chromium (Cr) and nitrogen (N), or comprise aluminium (Al), chromium (Cr), nitrogen (N) and one or more dopant elements selected from boron (B), yttrium (Y), tantalum (Ta), silicon (Si), tungsten (W), titanium (Ti), calcium (Ca), magnesium (Mg), iron (Fe), cobalt (Co), zinc (Zn) and niobium (Nb), i.e. the A-layers comprise Al, Cr and N and optionally further comprise one or more dopant elements as mentioned above.

The B-layers comprise aluminium (Al), chromium (Cr), nitrogen (N) and one or more dopant elements selected from boron (B), yttrium (Y), tantalum (Ta), silicon (Si), tungsten (W), titanium (Ti), calcium (Ca), magnesium (Mg), iron (Fe), cobalt (Co), zinc (Zn) and niobium (Nb), i.e. the B layers comprise Al, Cr, N and one or more dopant elements as mentioned above.

According to a preferred embodiment the chemical elements comprised in the B layers differ from the chemical elements comprised in the A layers at least in one chemical element, it means, if both the layers of type A and the layers of type B comprise one or more dopants, then at least one of the dopants present in the B layers is not present in the A layers, or at least one of the dopants present in the A layers is not present in the B layers, wherein the concentration of the one or more dopants in the layers of type B (also called B layers in the context of the present invention) is higher than the concentration of the one or more dopants in the layers of type A (also called A layers in the context of the present invention).

According to a further preferred embodiment the chemical elements comprised in the B layers can be the same chemical elements comprised in the A layers, but in this case both the B layers and the A layers comprise one or more dopants and the chemical composition of the A layers differs from the chemical composition of the B layers in the concentration of the chemical elements, wherein the concentration of the one or more dopant elements in the B layers is higher than the concentration of the one or more dopant elements in the A layers.

According to a preferred embodiment of a method according to the present invention the chemical element composition of the $A_{source}$-targets used for producing the A layers differ from the chemical composition of the $B_{source}$-targets used for producing the B layers in at least one chemical element, i.e. at least one chemical elements contained in the $B_{source}$-targets is not contained in the $A_{source}$-targets or at least one chemical elements contained in the $A_{source}$-targets is not contained in the $B_{source}$-targets, and the concentration of the one or more dopants in the $B_{source}$-targets is higher than the concentration of the one or more dopants in the $A_{source}$-targets.

According to a further preferred embodiment of a method according to the present invention the chemical element composition of the $A_{source}$-targets used for producing the A layers differ from the chemical composition of the $B_{source}$-targets used for producing the B layers in the concentration of the chemical elements, i.e. if the chemical elements contained in the $B_{source}$-targets are identical to the chemical elements contained in the $A_{source}$-targets, then both kind of targets comprises one or more dopant elements and the chemical element concentration of the chemical elements in the $A_{source}$-targets differs from the chemical element concentration in the $B_{source}$-targets, and the concentration of the one or more dopants in the $B_{source}$-targets is higher than the concentration of the one or more dopants in the $A_{source}$-targets.

Figure 1B:
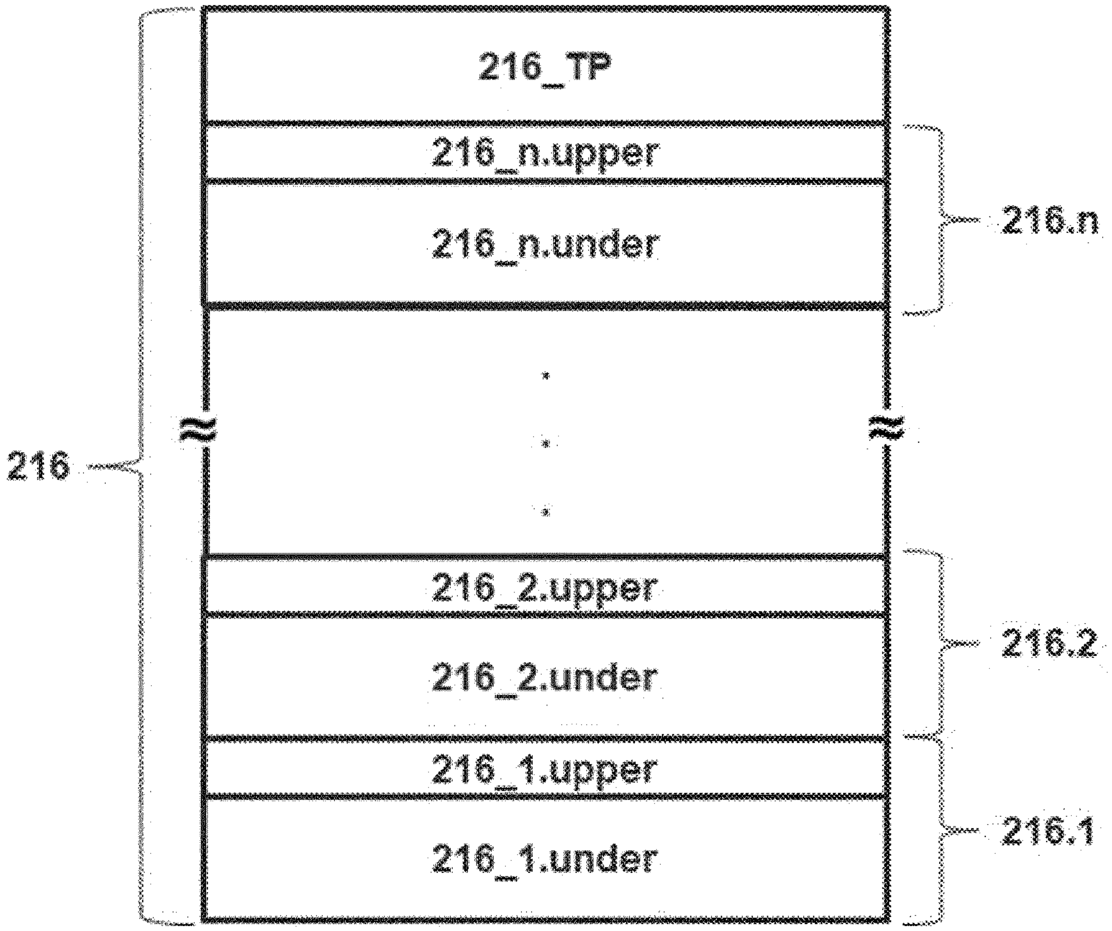

The interjacent coating film 216 consists of one or more film sections 216.*i* as it is schematically shown in FIG. 1*b*, with i varying from i=1 to i=n, where i and n are natural numbers and n≥1, preferably n≥2.

Those interjacent coating film sections do not necessarily have to be with the same thickness.

In all these film sections, preferably all A layers are produced by using the same targets (in the context of the present invention also called $A_{source}$-targets), and preferably all B layers are produced by using the same targets (in the context of the present invention also called $B_{source}$-targets).

Those interjacent coating film sections are different in minimum one of the following physical chemical properties: predominant crystalline orientation, crystalline size and/or crystalline size distribution (as all calculated from peak intensities and areas below the peaks and the full width at the half maximum from X-Ray diffractograms), mechanical properties (e.g. hardness, elastic modulus), chemical composition.

The differences regarding the above mentioned physical chemical properties in the different film sections 216.1 to 216.*n* (it means the differences between the different interjacent film sections 216.*i*) are preferably produced by changing one or more process parameters during coating deposition process, in particular one or more process parameters selected from: pressure, temperature, bias voltage, bias current, source current, magnetic field shape, magnetic field strength, reactive gas flow, reactive gas partial pressure, kind of reactive gases being introduced in the coating chamber.

However, in despite of any changes in the process parameters by the deposition of the interjacent coating film 216, the whole interjacent coating film 216 is preferably produced by using the same targets $A_{source}$-targets and the same $B_{source}$-targets for the deposition of the A layers and the B layers, respectively, for all the interjacent film sections 216.*i*, it means from i=1 to i=n.

According to a preferred embodiment of the present invention, the coating system is designed having an interjacent coating film 216 comprising different film sections 216.*i*, with i varying from i=1 to i=n as schematically illustrated in FIG. 1*b*, where i and n are natural numbers, i.e. comprising sections 216.1 to 216.*n*, where the number of the interjacent film sections 216.*i* is at least one. i.e. n≥1, preferably more than one, i.e. n≥2, wherein each one of said interjacent film sections 216.*i* comprises an under portion

Figure 1C:
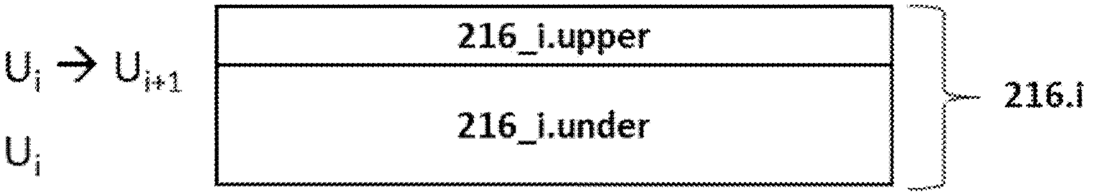
Figure 1D:
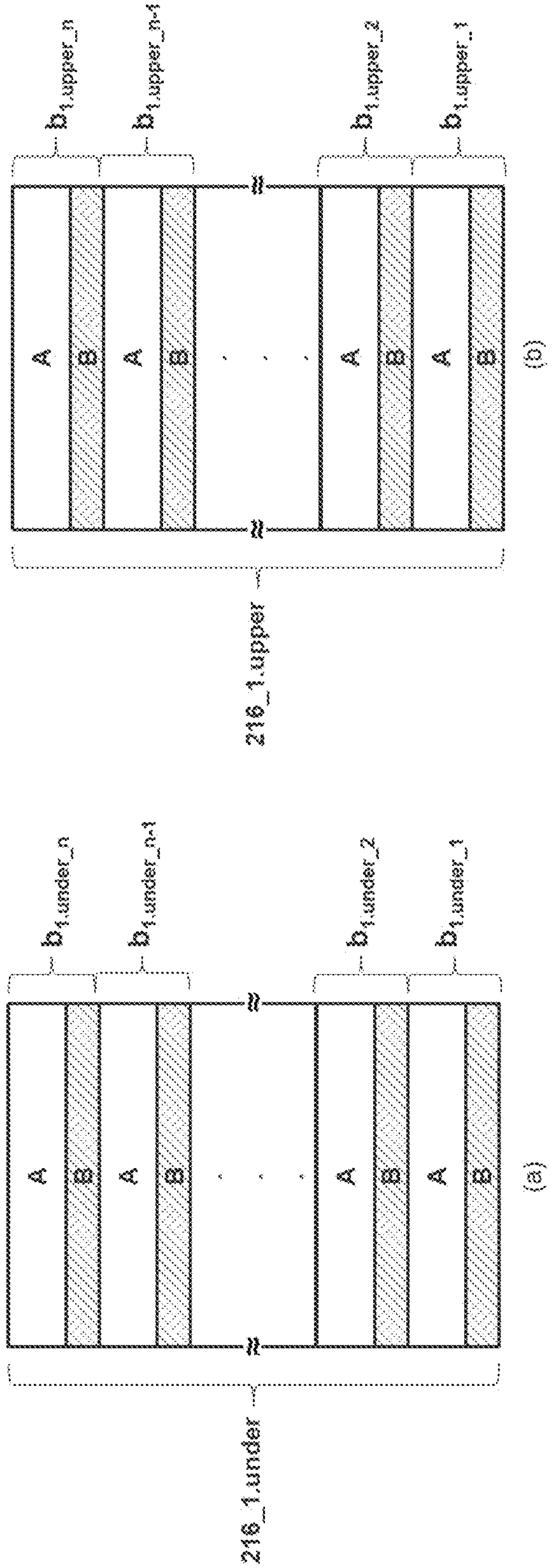

216.*i*.under and an upper portion 216.*i*.upper, as schematically illustrated in FIG. 1*b* and FIG. 1*c*, each one of the portions being formed by one or more bilayers b, each bilayer b being formed by one layer A and one layer B as it is schematically illustrated in FIG. 1*d*, wherein all A layers within the extension of the thickness of the interjacent coating film 216 comprise the same chemical elements but not necessarily in the same concentration, and all B layers within the extension of the thickness of the interjacent coating film 216 comprise the same chemical elements but not necessarily in the same concentration.

Preferably at least two interjacent film sections deposited one on each other, e.g. 216.1 and 216.2 differs in at least one of the following physical chemical properties: predominant crystalline orientation, crystalline size and/or crystalline size distribution—as all calculated from peak intensities and areas below the peaks and the full width at the half maximum from X-Ray diffractograms-, mechanical properties such as hardness, elastic modulus, and/or chemical composition.

According to one preferred embodiment of the present invention at least one upper portion 216.*i*.upper deposited on a respective under portion 216.*i*.under exhibits a different intrinsic stress than the respective under portion. This feature is preferably produced by applying a constant bias voltage having value $U_i$ during deposition of the under portion 216.*i*.under, and by applying a variable bias voltage varying from a value $U_i$ to a value $U_{i+1}$ during deposition of the upper portion 216.*i*.upper, as it is schematically illustrated in FIG. 1*c*, where preferably $U_i$ and $U_{i+1}$ are negative bias voltages and $U_{i+1}$ in absolute value is higher than $U_i$ in absolute value, i.e. $|U_{i+1}|>|U_i|$. Preferably, at least two under portions belonging respectively to two consecutive deposited interjacent film sections (e.g. 216.1.under comprised in 216.1 and 216.2.under comprised in 216.2, where 216.1 is closer to the substrate than 216.2) exhibit different intrinsic stress, and preferably the under portion that is closer to the substrate (e.g. 216.1.under) exhibits lower intrinsic stress than the other under portion (e.g. 216.2.under). This feature is preferably produced by applying a constant negative bias voltage having value $U_i$ during deposition of the under portion 216.*i*.under, and by applying a different constant negative bias voltage having value $U_{i+1}$ during deposition of the under portion 216.*i*+1.upper, where the bias voltage $U_{i+1}$ in absolute value is higher than the bias voltage $U_i$ in absolute value, i.e. $U_{i+1}>U_i$, as it is schematically illustrated in FIG. 1*c*. For example by applying a first constant negative bias voltage $U_1$ for the deposition of 216.1.under and a second constant negative bias voltage $U_2$ for the deposition of 216.2.under, where 216.1.under is closer to the substrate than 216.2.under and $U_i$ is lower than $U_2$ in absolute value, i.e. $|U_1|<|U_2|$, it is attained that the intrinsic stress in 216.2.under is higher that the intrinsic stress in 216.1.under. The intrinsic stress in this context is preferably a compressive stress.

The A layers and B layers present as bilayers b in the respective under portions and upper portions as schematically illustrated in FIG. 1*d*, are preferably deposited as nanolayers.

The thickness of an upper portion 216.*i*.upper is lower than the thickness of the corresponding under portion 216.*i*.under, on which the upper portion 216.*i*.upper is deposited, i.e thickness of 216.*i*.under>thickness of 216.*i*.upper.

The interjacent coating film 216 can also comprise a top layer 216_TP as schematically shown in FIG. 1*b*.

Preferably a negative bias voltage is applied during deposition of the interjacent coating film 216 and preferably the value of the negative bias voltage is increased (in absolute value) from a lower bias voltage U1 used at the beginning of the deposition of the interjacent coating film 216 up to a higher bias voltage Un used at the end of the deposition of the interjacent coating film 216. Preferably this bis voltage variation is carried our in such a manner that the bias voltage is maintained as possible constant at a value $U_i$ during deposition of the respective under portions 216.*i*.under, and is increased gradually from $U_i$ to a higher value $U_i$+1 during the deposition of the respective upper portion 216.*i*.upper.

According to the present invention the individual layer thickness of the A layers is greater than the individual layer thickness of the B layers, schematically illustrated in FIG. 1*d*.

The ratio between the individual layer thickness of the A layers in relation to the individual layer thickness of the B layers is in a range between 50% to 400% greater.

The thickness of the under coating film 212 is preferably between 65% and 97% of the total thickness of the coating system 210.

The thickness of the upper coating film 220 is preferably between 3% and 35% of the total thickness of the coating system 210.

The layer thickness of the upper coating film is 220 preferably lower than the layer thickness of the under coating film 212.

According to a preferred embodiment of the present invention:

- the upper coating film 220 and/or the interjacent coating film 216, or
- at least one section of the upper coating film 220 (i.e. one portion of the upper coating film 220 that extends along the thickness of the upper coating film 220 without containing the complete extension or the whole upper coating film 220 along its thickness) and/or at least one section of the interjacent coating film 216 comprises oxygen (O) and/or carbon (C), in addition to nitrogen (N), in this manner, it can be attained that

- the upper coating film 220 and/or the interjacent coating film 216, or
- at least one section of the upper coating film 220 and/or at least one section of the interjacent coating film 216 comprise not only metal nitrides but also metal oxynitrides or metal carbonitrides or metal carboxynitrides.

The concentration in atomic percentage of carbon and/or oxygen in one coating layer or in one coating film forming the coating system 210 is preferably between 3 at. % and 38 at. %, if only the concentrations of N, C and O are considered, it means, if the sum of the concentrations of N, C and O in the respective coating layer or coating film is considered as 100 at. %.

The ratio of concentration in atomic percentage of aluminium to chromium (Al/Cr) preferably varies along the total thickness of the coating system. The range of variation of the ratio of concentration Al/Cr in this case is preferably between 69/31 and 79/21.

The concentration in atomic percentage of the dopant elements in the B layers and in the case that the A layers comprise dopant elements, then also in the A layers, is between 0.1 at. % and 20 at. %, preferably between 0.5 at. % and 15 at. %, if the concentrations of all elements are considered, it means, if the sum of the concentrations of all elements in the respective B layer or A layer are considered as 100 at. %.

The concentration in atomic percentage of the dopant elements in the B layers and in the case that the A layers comprise dopant elements, then also in the A layers preferably varies along the total thickness of the interjacent coating film of the coating system. The range of variation is preferably between 0.1% and 600% taking as base the lowest concentration of the respective dopant elements in the interjacent coating film.

The under coating film 212 comprises preferably the same elements as the layer A.

The upper coating film 220 comprises either:

- preferably the same chemical elements as the layers B, it means the upper coating film 220 can be deposited as monolayer, or
- preferably both the chemical elements of the layers A and the chemical elements of the layers B, it means the upper coating film 220 can be deposited as multilayer having a multilayer periodicity comprising layers A and B produced by the use of the same targets used for deposition of the interjacent coating film 216 but having different ratio of thickness of layers A and B and different chemical composition in comparison with the interjacent coating film 216. The thickness of layer A with respect to the thickness of layer B in the upper coating film 220 can be lower or equal or higher, but in the last case it has to be less high than in the section 216, i.e. if $A_{layer\_thickness\_in\_220}/B_{layer\_thickness\_in\_220}>0$, then $A_{layer\_thickness\_in\_216}/B_{layer\_thickness\_in\_216}>A_{layer\_thickness\_in\_220}/B_{layer\_thickness\_in\_220}$.

Notwithstanding that all layers A are produced from the same $A_{source}$-targets and all B layers are produced from the same $B_{source}$-targets, it does not mean that the chemical composition of all A layers is the same and it also does mean that the chemical composition of all B layers is the same along the thickness of the coating film or along the section of the coating film comprising these A and B layers, because since the process parameters can be varied, also the concentration of the chemical elements in the respective A layers and B layers can be varied because of the influence of the different process parameters being used during coating deposition.

Likewise, notwithstanding that one coating film is produced from the same target or targets, it does not mean that the chemical composition of this coating film is the same along the thickness of the coating film, because of the influence of the process parameters being used during coating deposition as already mentioned above.

The concentration of the dopant elements in the under coating film 212, if any, and/or in the upper coating film 220, preferably varies along the total thickness of the under coating film 212 and/or along the total thickness of the upper coating film 220 of the coating system 210. The range of variation is preferably between 0.1% and 600% taking as base the lowest concentration of the respective dopant elements in the under coating film or in the upper coating film, respectively.

The inventive coating system (also called coating scheme in this context as already mentioned above) comprises as described above layers arrangements especially adjusted in inventive manner which allow simultaneous fulfilment of following challenging requirements:

- reduction of abrasive wear,
- reduction of crater wear,
- reduction/suppression of thermal crack formation and propagation, and
- enabling heat transfer from the end mill-chip interface to the substrate and coating-substrate interface.

In order to exemplary show the surprisingly benefit attained by using coating systems according to the present invention, some examples will be described below. These examples should not be understood as a limitation of the invention but only as showcases:

Process parameters used for the deposition of some examples of inventive coating systems 210:

- Range of pressure: 0.1 Pa to 9 Pa ($N_2$ partial pressure controlled)
- Range of substrate temperature: 200° C. to 600° C.
- Range of bias voltage: +20 V to −300 V
- Range of source current: 50 A to 200 A For the deposition of the inventive examples coating parameters were selected from the above mentioned ranges and also varied for varying properties as required.

The elements nitrogen, carbon and oxygen were provided in the coating chamber for the formation of the coating systems 210 by using respective reactive gases, e.g. $N_2$ gas for providing nitrogen, $O_2$ gas for providing oxygen, $C_2H_2$ or $CH_4$ for providing carbon.

For providing Al, Cr and the dopant elements solid targets were used as cathode to be evaporated and in this manner being used as material source for the formation of the coating system.

The targets were preferably operated as cathode in arc evaporators used as arc PVD sources.

Meaning the process is reactive: reactive cathodic PVD coating process.

During the whole coating process for the deposition of the coating scheme 210 minimum of two mutually different targets (mutually different targets means that one target is different from the other) were used. Those targets were mutually different with respect to minimum one of the following aspects:

1) concentration of Al in total Al+Cr content (meaning Al/(Al+Cr) in at. %), and/or
2) total concentration of all dopants together with respect to the total metal concentration and/or
3) concentration of one of the dopant with respect to the total dopant concentration and/or total element concentration.

AlCr metallic targets were used in the present examples as Al and Cr source, the AlCr metallic targets having a concentration (Al/(Al+Cr)) in at. %) of minimum 68% of Al with respect to Al and Cr.

All dopants (metal or semi-metal dopants) were provided directly as dopants in the AlCr targets.

In the following examples AlCr targets were used as $A_{source}$-targets and AlCrB targets were used as $B_{source}$-targets, however these examples should not be understood as a limitation of the present invention but only as showcases.

Results of the Cutting Tests:

Milling of hardened steel (steel type 1.2344) 38 HRC roughing and 45 HRC finishing in wet condition. 38 HRC roughing test is referred to as example test 1.

45 HRC finishing test is referred to as example test 2.

Example test 1 comprises a test of coated cutting end mills labelled as:

- State of the art=Benchmark coating in the commercial market
- Exemplarily inventive coatings 1, 2, 3 as given in this invention.

Figure 2:
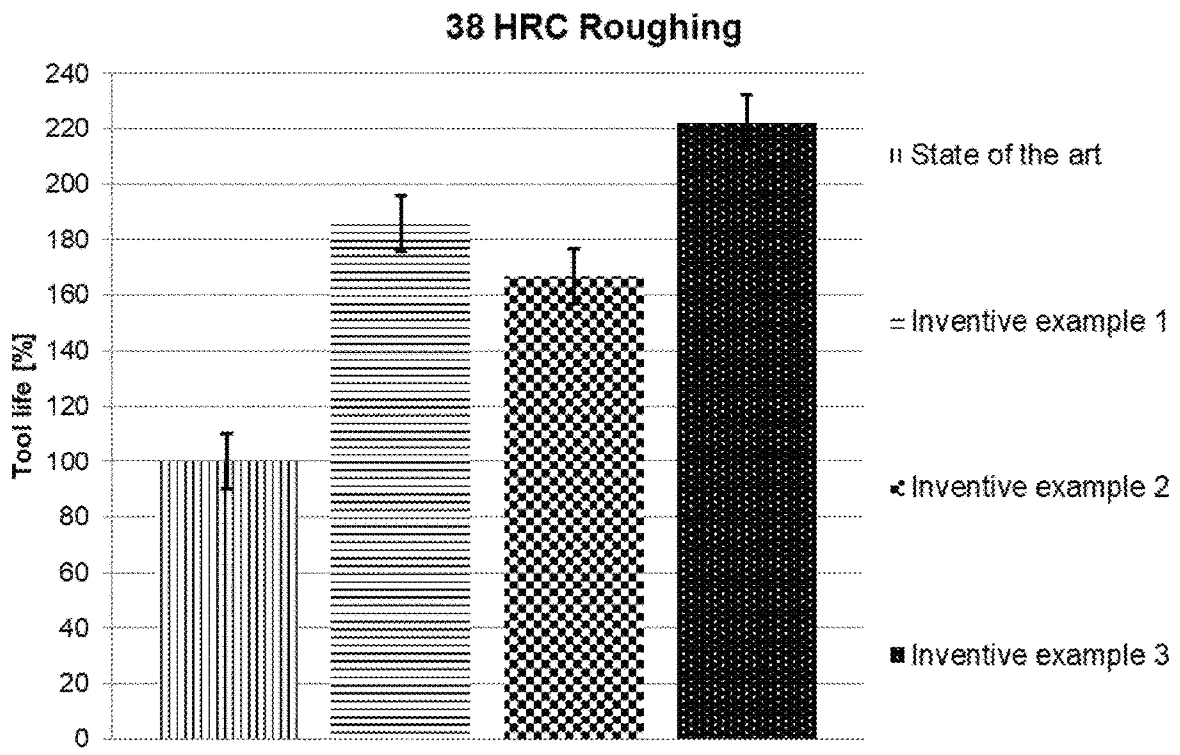

Test parameters for 38 HRC roughing: Here the performance of roughing using end mills is tested. The workpiece material is 38 HRC hardened steel (1.2344). The tools are cemented carbide endmills with a diameter=10 mm, with 4 teeth. The cutting parameters are set forth below: cutting speed Vc=175 m/min; Feed rate f=0.05 mm/tooth; Depth of cut ap=5.0 mm; Width of cut ae=4 mm; external cooling: wet; and wear criterion: VBmax=120 μm. The tool life in % is given in FIG. 1 comparing state of the art and three inventive examples. The difference in wear progression after the test duration is given in FIG. 2 for state of the art and one inventive example. In FIG. 2 one of the four main cutting edges is shown which is a representative example.

FIG. 2 shows a comparison of the lifetime of coated cemented carbide end mills in the example test 1, a wet milling cutting test of 38 HRC hardened steel (steel type 1.2344) application of a wear-resistant coating scheme of three exemplary (inventive examples 1, 2, 3) inventions tested against state of the art as market benchmark. It can be seen that inventive coatings have remarkable increase of tool life of up to 220% as compared to state of the art as market benchmark.

Figure 3:
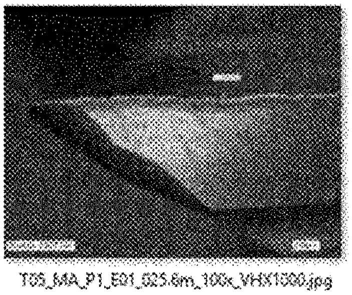
Figure 3:
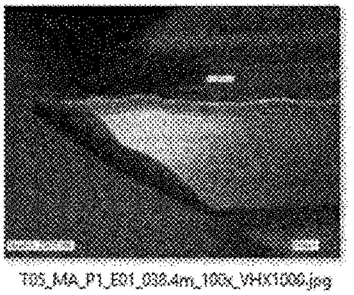
Figure 3:
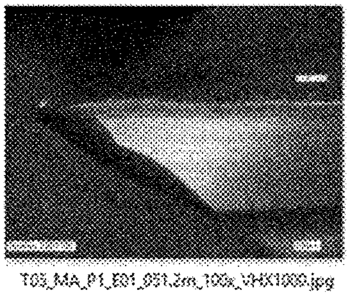
Figure 3:
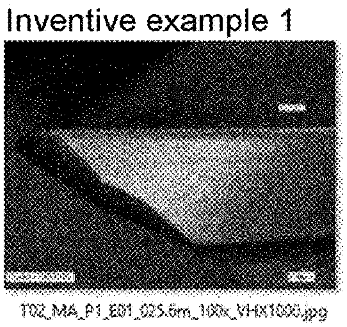
Figure 3:
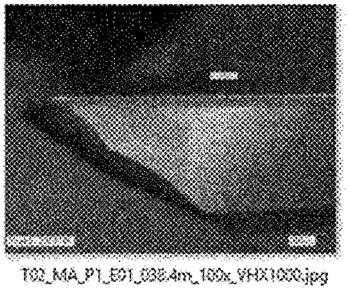
Figure 3:
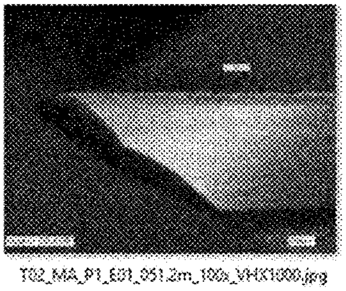
Figure 3:
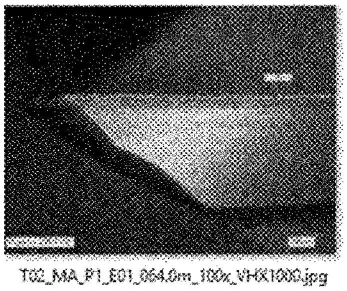
Figure 3:
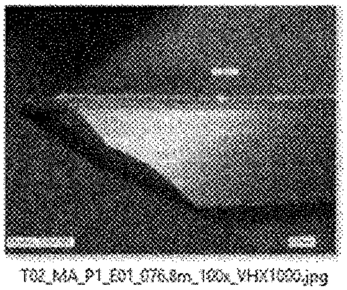
Figure 3:
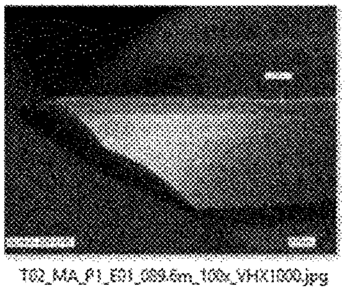
Figure 3:
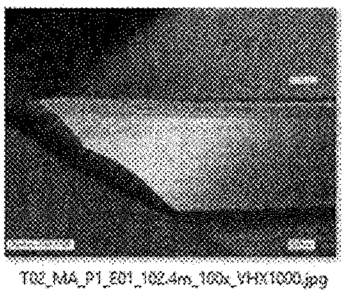

FIG. 3 shows wear and wear evolution of coated cemented carbide end mills in the example test 1 given on the representative example of 1 tool per variant taken among the tested tools, a wet milling cutting test of 38 HRC hardened steel (steel type 1.2344) application of a wear-resistant coating scheme of the inventive example 1 tested against state of the art as benchmark. It can be seen that both wear, especially starting wear, is much higher and wear progression is much faster in state of the art coating as compared to inventive coating. Thus, the state of the art coating failed earlier as illustrated by tool life for example 1 test in FIG. 2. Contrary, the inventive coating of the example 1 has very low starting wear and uniform wear progression without chipping until the end of tool life defined by maximum wear (VBmax).

Example test 2 comprises a test of coated cutting end mills labelled as:

State of the art=Benchmark coating in the commercial market

Exemplarily inventive coatings 1, 2, 4 as given in this invention.

Figure 5:
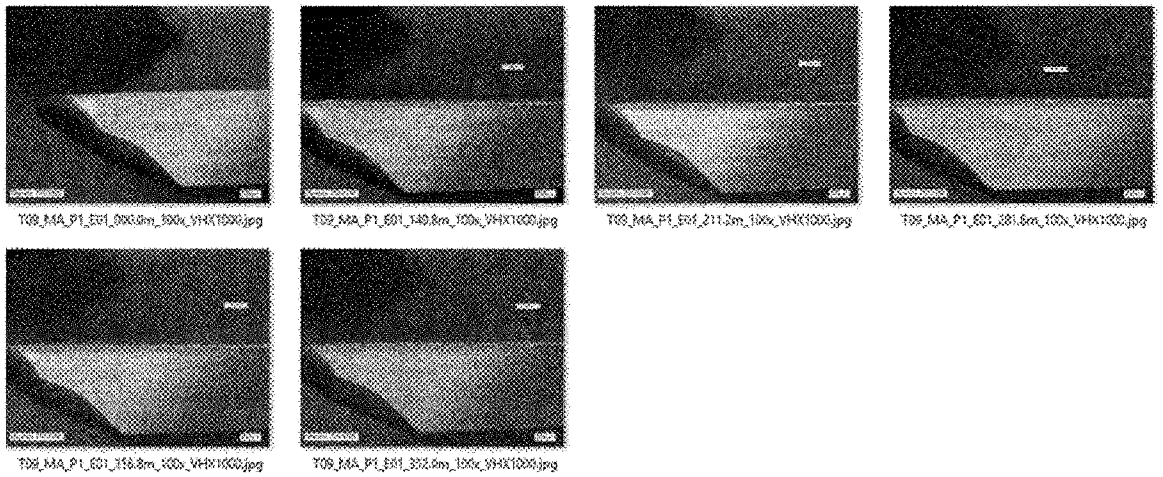
Figure 5:
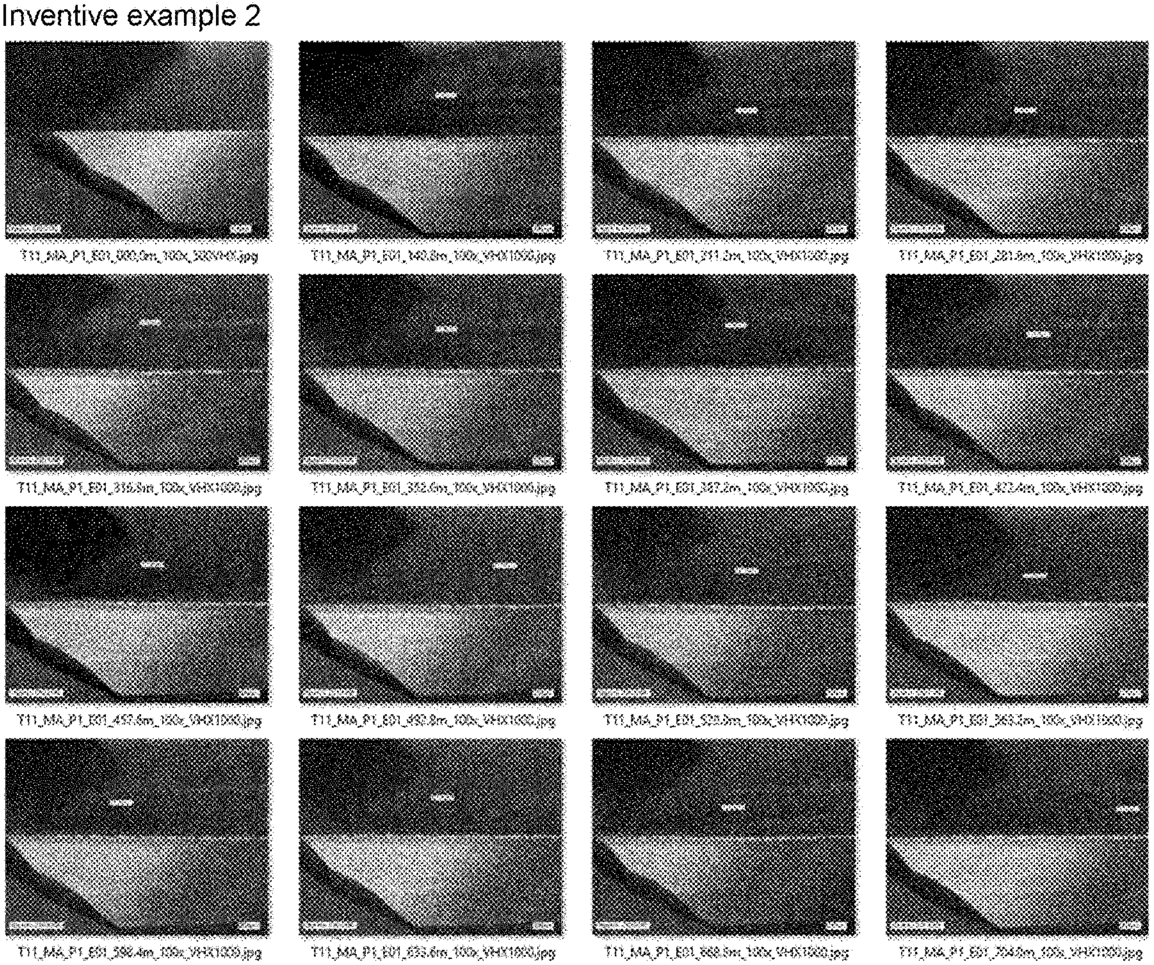

Test parameters for 45 HRC finishing: Here the performance of finishing using end mills is tested. The workpiece material is 45 HRC hardened steel (1.2344). The tools are cemented carbide endmills with a diameter=10 mm, with 4 teeth. The cutting parameters are set forth below: cutting speed Vc=150 m/min; Feed rate f=0.1 mm/tooth; Depth of cut ap=5.0 mm; Width of cut ae=0.5 mm; external cooling: wet; and wear criterion: VBmax=140 μm. The tool life in % is given FIG. 3 comparing state of the art and three inventive examples (1, 2, 4). The difference in wear progression after the test duration is given in FIG. 5 for state of the art and one inventive example (4). In FIG. 5 one of the four main cutting edges is shown as a representative example.

Figure 4:
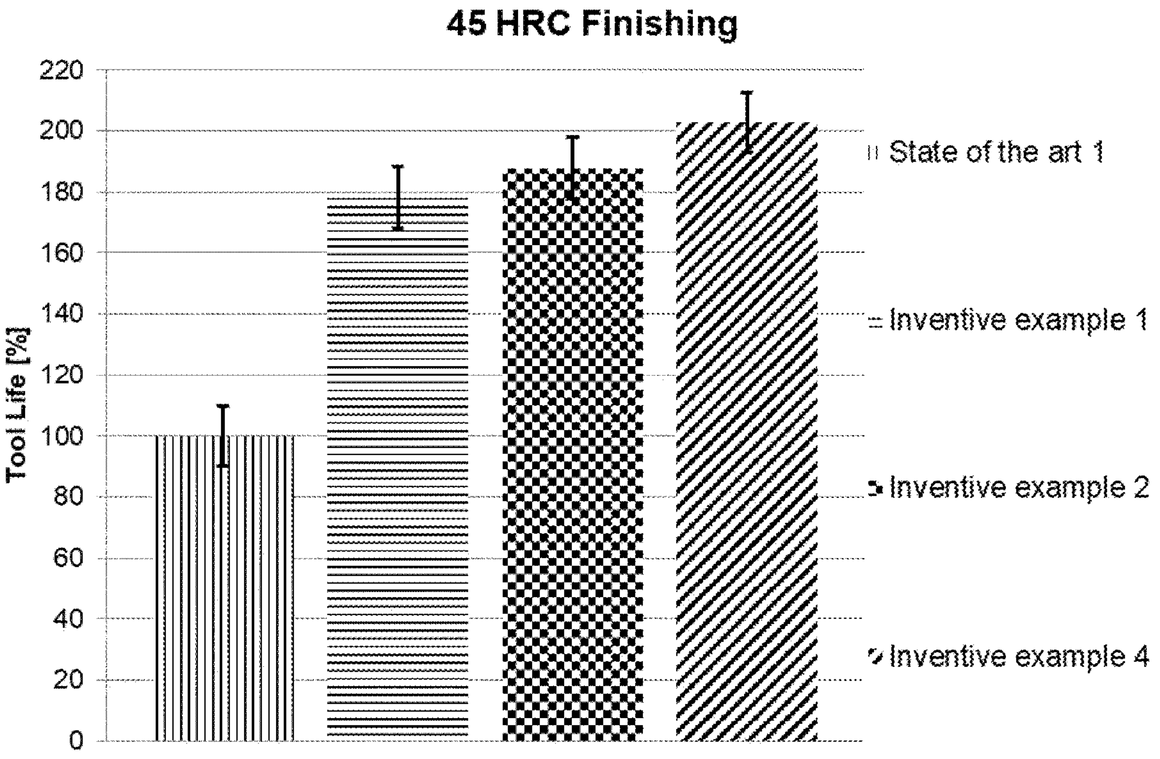

FIG. 4 shows a comparison of the lifetime of coated cemented carbide end mills in the example test 2, a wet milling cutting test of 45 HRC hardened steel (steel type 1.2344) application of a wear-resistant coating scheme of three exemplary (inventive examples 1, 2, 4) inventions tested against state of the art as market benchmark. It can be seen that inventive coatings have remarkable increase of tool life of up to 200% as compared to state of the art as market benchmark.

FIG. 5 shows wear and wear evolution of coated cemented carbide end mills in the example test 2 given on the representative example of 1 tool per variant taken among the tested tools, a wet milling cutting test of 45 HRC hardened steel (steel type 1.2344) application of a wear-resistant coating scheme of the inventive example 2 tested against state of the art as benchmark. It can be seen that both wear, especially starting wear, is much higher and wear progression is much faster in state of the art coating as compared to inventive coating. Thus, the state of the art coating failed earlier as illustrated by tool life for example 2 test in FIG. 4. Contrary, the inventive coating of the example 2 has very low starting wear and uniform wear progression without chipping until the end of tool life defined by maximum wear (VBmax).

In Table 1 are given properties of state-of-the-art coating and of the inventive coating. Those properties are hardness (H), elastic modulus (E), ratios H/E, ratio $H^3/E^2$ and compressive stress. The properties of the inventive coatings as indicated in Table 1 show that these inventive coatings have in common following features: possess increased E, lower H values, slightly lower ratio of H/E, clearly lower ratio of $H^3/E^2$ and higher compressive stress with respect to the state of the art example. In addition, the significantly higher compressive stress is kept on the level which is beneficial for wear resistance while still being on a level where no failure between substrate and coating is taking place. All these in combination with the dedicated new architecture also in combination with dedicated chemistry including alloying and doping allows for simultaneous: reduction of abrasive wear, reduction of crater wear, reduction/suppression of thermal crack formation and propagation, and enabling heat transfer from the end mill-chip interface to the substrate and coating-substrate interface of the here shown inventive coatings.

Table 1 shows properties (hardness, elastic modulus, their ratios and compressive stress) of state of the art coating and of examples of inventive coatings;

| | H [GPa] | E [GPa] | H/E | H3/E2 [GPa] | Stress [GPa] |
|---|---|---|---|---|---|
| State of the art | 43.4 ± 3.4 | 381.2 ± 21.2 | 0.1 | 0.55 | −2.4 |
| Inventive example 1 | 41.8 ± 2.4 | 458.0 ± 22.0 | 0.09 | 0.35 | −3.9 |
| Inventive example 2 | 41.7 ± 2.3 | 464.9 ± 17.4 | 0.09 | 0.34 | −3.9 |
| Inventive example 3 | 37.4 ± 1.7 | 436.5 ± 15.9 | 0.09 | 0.27 | −3.8 |
| Inventive example 4 | 37.2 ± 3.6 | 411.5 ± 32.4 | 0.09 | 0.31 | −4.3 |

What is claimed is:

1. A coating system (210) deposited on a surface of a substrate (201), the coating system comprising an under coating film (212), an interjacent coating film (216) deposited as a multi-layered film, the multi-layered film consisting of a plurality of A-layers and a plurality of B-layers deposited in an alternating sequence, each of the A-layers comprising aluminium chromium and optionally one or more dopant elements and each of the B-layers comprising aluminium chromium nitride and one or more dopant elements, wherein, the under coating film (212) is deposited on the surface of the substrate (201) to be coated or in any case closer to the substrate (201) than the interjacent coating film (216), the interjacent coating film (216) is deposited between the under coating film (212) and an upper coating film (220), the upper coating film (220) is deposited more distant from the substrate (201) than the interjacent coating film (216), each of the A-layers comprise:
aluminium (Al), chromium (Cr) and nitrogen (N), or
aluminium (Al), chromium (Cr), nitrogen (N) and one or more dopant elements selected from boron (B), yttrium (Y), tantalum (Ta), silicon (Si), tungsten (W), titanium (Ti), calcium (Ca), magnesium (Mg), iron (Fe), cobalt (Co), zinc (Zn) and niobium (Nb),
each of the B-layers comprise aluminium (Al), chromium (Cr), nitrogen (N) and one or more dopant elements selected from boron (B), yttrium (Y), tantalum (Ta), silicon (Si), tungsten (W), titanium (Ti), calcium (Ca), magnesium (Mg), iron (Fe), cobalt (Co), zinc (Zn) and niobium (Nb),
wherein:
the A layers differ from the B layers at least in the chemical composition of each layers, wherein:
at least one chemical element is present in each of the B layers but not present in each of the A layers or is present in each of the B layers but not present in each of the A layers, or
if both A layers and B layers contain the same chemical elements, then a concentration of the chemical elements in the B layers differs from the concentration of the chemical elements in the A layers, and
a concentration of the one or more dopants in each of the B layers is higher than a concentration of the one or more dopant elements in each of the A layers, if any, and
wherein a ratio of concentration in atomic percentage of aluminium to chromium (Al/Cr) varies along a total thickness of the coating system, wherein a range of variation of the ratio of concentration Al/Cr is between 69/31 and 79/2.

2. The coating system according to claim 1, wherein the upper coating film (220) is deposited as outermost layer of the coating system.

3. The coating system according to claim 1, wherein an individual layer thickness of the A layers is greater than an individual layer thickness of the B layers.

4. The coating system according to claim 1, wherein a ratio between an individual layer thickness of the A layers in relation to an individual layer thickness of the B layers is in a range between 1% and 600%.

5. The coating system according to claim 1, wherein a thickness of the under coating film (212) is between 65% and 97% of a total thickness of the coating system.

6. The coating system according to claim 1, wherein a thickness of the upper coating film is between 3% and 35% of a total thickness of the coating system.

7. The coating system according to claim 1, wherein a layer thickness of the upper coating film is lower than a layer thickness of the under coating film.

8. The coating system according to claim 1, wherein:
the upper coating film (220) or at least a section of the upper coating film (220), or at least some of the A layers and/or some of the B-layers comprised in the upper coating film (220), if any,
and/or
the interjacent coating film (216) or at least a section of the interjacent coating film (216), or at least some of the A layers and/or some of the B-layers comprised in the interjacent coating film (216)
comprise in addition to nitrogen (N) also oxygen (O) and/or carbon (C).

9. The coating system according to claim 8, wherein the concentration in atomic percentage of carbon and/or oxygen in one coating layer or in one coating film forming the coating system is between 3 at. % and 38 at. %, if only the concentrations of N, C and O are considered, it means, if the sum of the concentrations of N, C and O in the respective coating layer or coating film is considered as 100 at. %.

10. The coating system according to claim 1, wherein the concentration in atomic percentage of the one or more dopant elements in the B layers and in the case that the A layers comprise dopant elements, then also in the A layers, is between 0.1 at. % and 20 at. %, if the concentrations of all elements are considered, it means, if the sum of the concentrations of all elements in the respective B layer or A layer are considered as 100 at. %.

11. The coating system according to claim 1, wherein the concentration in atomic percentage of the dopant elements in the B layers and in the case that the A layers comprise dopant elements, then also in the A layers varies along a total thickness of the interjacent coating film of the coating system, a range of variation is between 0.1% and 600% taking as base a lowest concentration of the respective dopant elements in the interjacent coating film.

12. The coating system according to claim 1, comprise the same chemical elements but not necessarily in the same concentration, and each of the plurality of B-layers comprise the same chemical elements but not necessarily in the same concentration,
wherein at least one layer of the plurality of A-layers differs from at least one of the plurality of B-layers in at least one of the following physical chemical properties: predominant crystalline orientation, crystalline size and/or crystalline size distribution—as all calculated from peak intensities and areas below the peaks and the full width at the half maximum from X-Ray diffractograms, mechanical properties such as hardness, elastic and modulus, chemical composition.

13. The coating system according to claim 12, wherein at least one layer of the plurality of A-layers differs from at least one of the plurality of B-layers in intrinsic stress, where the respective layer closer to the substrate exhibits lower intrinsic stress than the other respective layer.

14. The coating system according to claim 1, wherein the under coating film (212) comprises the same elements as the plurality of A-layers.

15. The coating system according to claim 1, wherein the upper coating film (220) comprises either:
1) The same chemical elements as the plurality of B-layers, and in this case the upper coating film (220) is produced by using the same targets used for the deposition of the layers B, deposited as monolayer, or
2) The same chemical elements of the plurality of A-layers and the same chemical elements of the plurality of B-layers, and in this case the upper coating film (220) is produced as multilayer by using respectively the same targets used for the deposition of the layers in the interjacent coating film (216) but the upper coating film (220) having a different ratio of thickness of A-layers and B-layers and a different chemical composition in comparison with the interjacent coating film (216), wherein a thickness of the individual A-layers with respect to a thickness of the individual B-layers in the upper coating film (220) is either lower or equal or higher but if $A_{layer\_thickness\_in\_220}/B_{layer\_thickness\_in\_220}>0$, then $A_{layer\_thickness\_in\_216}/B_{layer\_thickness\_in\_216}>A_{layer\_thickness\_in\_220}/B_{layer\_thickness\_in\_220}$.

16. The coating system according to claim 1, wherein a concentration of the dopant elements in the under coating film, if any, as well as in the upper coating film varies along a total thickness of the under coating film.

17. The coating system according to claim 1, wherein a concentration of the dopant elements varies along a total thickness of the upper coating film of the coating system.

18. The coating system according to claim 15, wherein a range of variation is between 0.1% and 600% taking as base a lowest concentration of the respective dopant elements in the under coating film or in the upper coating film, respectively.

19. A method for producing a coating system according to claim 1, wherein the coating system is produced by using a reactive cathodic arc PVD method, wherein for a deposition of the A layers one or more $A_{source}$-targets are used, and wherein for a deposition of the B layers one or more $B_{source}$-targets are used, wherein at least nitrogen gas is used as a reactive gas, and the $A_{source}$-targets comprise Al and Cr and optionally one or more dopant elements selected from B, Y, Ta, Si, W, Ti, Ca, Mg, Fe, Co, Zn and Nb, and the B layers $B_{source}$-targets comprise Al and Cr and one or more dopant elements selected from B, Y, Ta, Si, W, Ti, Ca, Mg, Fe, Co, Zn and Nb, wherein the $A_{source}$-targets and the $B_{source}$-targets, if both comprise one or more dopant elements, differ one from each other in at least one dopant element, and wherein during the deposition of the coating system at least one of the following parameters:

gas pressure, temperature, bias voltage, source current, magnetic field shape and/or strength and reactive gases, is varied for varying at least one of the following physical chemical properties of the coating:

predominant crystalline orientation, crystalline size and/or crystalline size distribution—as all calculated from peak intensities and areas below the peaks and the full width at the half maximum from X-Ray diffractograms-, mechanical properties such as hardness and elastic modulus, and chemical composition.

* * * * *